United States Patent
Hirata (10) Patent No.: US 10,094,047 B2
(45) Date of Patent: Oct. 9, 2018

(54) WAFER PRODUCING METHOD

(71) Applicant: DISCO CORPORATION, Tokyo (JP)

(72) Inventor: Kazuya Hirata, Tokyo (JP)

(73) Assignee: Disco Corporation, Tokyo (JP)

( * ) Notice: Subject to any disclaimer, the term of this patent is extended or adjusted under 35 U.S.C. 154(b) by 219 days.

(21) Appl. No.: 15/099,044

(22) Filed: Apr. 14, 2016

(65) Prior Publication Data

US 2016/0305042 A1 Oct. 20, 2016

(30) Foreign Application Priority Data

Apr. 15, 2015 (JP) ................. 2015-083643

(51) Int. Cl.
| | | |
|---|---|---|
| *B29C 35/08* | (2006.01) | |
| *C30B 33/02* | (2006.01) | |
| *C30B 29/40* | (2006.01) | |
| *B28D 1/22* | (2006.01) | |
| *H01L 21/02* | (2006.01) | |
| *B23K 26/00* | (2014.01) | |
| *B23K 26/08* | (2014.01) | |
| *B23K 26/0622* | (2014.01) | |
| *B23K 26/53* | (2014.01) | |
| *B24B 7/22* | (2006.01) | |
| *B23K 101/40* | (2006.01) | |

(52) U.S. Cl.
CPC .......... *C30B 33/02* (2013.01); *B23K 26/0057* (2013.01); *B23K 26/0622* (2015.10); *B23K 26/0853* (2013.01); *B23K 26/53* (2015.10); *B24B 7/22* (2013.01); *B28D 1/221* (2013.01); *C30B 29/406* (2013.01); *H01L 21/02005* (2013.01); *B23K 2201/40* (2013.01)

(58) Field of Classification Search
CPC ... C30B 33/02; C30B 29/406; B23K 26/0622; B23K 26/53; B23K 26/0057; B23K 26/0853; B24B 7/22; B28D 1/221; H01L 21/02005
See application file for complete search history.

(56) References Cited

U.S. PATENT DOCUMENTS

2009/0256240 A1* 10/2009 Hashimoto ............... C30B 7/10
257/615

FOREIGN PATENT DOCUMENTS

| JP | 2000-94221 | 4/2000 |
|---|---|---|
| JP | 2013-049161 | 3/2013 |

* cited by examiner

*Primary Examiner* — Stella Kim Yi
(74) *Attorney, Agent, or Firm* — Greer Burns & Crain Ltd.

(57) ABSTRACT

A wafer is produced from a compound single crystal ingot having end surface. A separation plane is formed by setting the focal point of a laser beam inside the ingot at a predetermined depth from the end surface. The depth corresponds to the thickness of the wafer to be produced. The laser beam is applied to the end surface to form a modified layer parallel to the end surface and cracks extending from the modified layer, thus forming the separation plane. The ingot has first atoms having a larger atomic weight and second atoms having a smaller atomic weight, and the end surface of the ingot is set as a polar plane where the second atoms are arranged in forming the separation plane. After producing the wafer from the ingot, the first end surface is ground to be flattened.

1 Claim, 9 Drawing Sheets

WAFER PRODUCING METHOD

BACKGROUND OF THE INVENTION

Field of the Invention

The present invention relates to a wafer producing method for producing a wafer from a compound single crystal ingot.

Description of the Related Art

Various devices such as ICs and LSIs are formed by forming a functional layer on the front side of a wafer formed of silicon or the like and partitioning this functional layer into a plurality of regions along a plurality of crossing division lines. The division lines of the wafer are processed by a processing apparatus such as a cutting apparatus and a laser processing apparatus to thereby divide the wafer into a plurality of individual device chips corresponding to the devices. The device chips thus obtained are widely used in various electronic equipment such as mobile phones and personal computers. Further, power devices or optical devices such as LEDs and LDs are formed by forming a functional layer on the front side of a wafer formed of a hexagonal single crystal such as SiC and GaN and partitioning this functional layer into a plurality of regions along a plurality of crossing division lines.

In general, the wafer on which the devices are to be formed is produced by slicing an ingot with a wire saw. Both sides of the wafer obtained above are polished to a mirror finish (see Japanese Patent Laid-open No. 2000-94221, for example). This wire saw is configured in such a manner that a single wire such as a piano wire having a diameter of approximately 100 µm to 300 µm is wound around many grooves formed on usually two to four guide rollers to form a plurality of cutting portions spaced in parallel with a given pitch. The wire is operated to run in one direction or opposite directions, thereby slicing the ingot into a plurality of wafers.

However, when the ingot is cut by the wire saw and both sides of each wafer are polished to obtain the product, 70% to 80% of the ingot is discarded to cause a problem of poor economy. In particular, a compound single crystal ingot of SiC or GaN, for example, has high Mohs hardness, and it is therefore difficult to cut this ingot with the wire saw. Accordingly, considerable time is required for cutting of the ingot, causing a reduction in productivity. That is, there is a problem in efficiently producing a wafer in this prior art.

A technique for solving this problem is described in Japanese Patent Laid-open No. 2013-49161. This technique includes the steps of setting the focal point of a laser beam having a transmission wavelength to SiC inside a compound single crystal ingot, next applying the laser beam to the ingot as scanning the laser beam on the ingot to thereby form a modified layer and cracks in a separation plane inside the ingot, and next applying an external force to the ingot to thereby break the ingot along the separation plane where the modified layer and the cracks are formed, thus separating a wafer from the ingot.

SUMMARY OF THE INVENTION

In the ingot cutting method described in Japanese Patent Laid-open No. 2013-49161, however, the laser beam is applied again to an end surface of the ingot from which the wafer has been separated, thereby forming a new separation plane containing a modified layer and cracks. Accordingly, the end surface of the ingot must be ground to be flattened, so that there is a problem such that the wear amount (consumption) of abrasive members for grinding the end surface of the ingot may become large and much time may be required for grinding, causing a reduction in productivity.

It is therefore an object of the present invention to provide a wafer producing method having a flattening step of grinding an end surface of a compound single crystal ingot, wherein the wear amount of abrasive members can be suppressed and the grinding time can also be reduced.

In accordance with an aspect of the present invention, there is provided a wafer producing method for producing a wafer from a compound single crystal ingot having a first end surface and a second end surface opposite to the first end surface. The wafer producing method includes a separation plane forming step of holding the second end surface of the compound single crystal ingot on a chuck table, next setting a focal point of a laser beam having a transmission wavelength to the ingot inside the ingot at a predetermined depth from the first end surface of the ingot, which depth corresponds to a thickness of the wafer to be produced, and next applying the laser beam to the first end surface as relatively moving the focal point and the ingot to thereby form a modified layer parallel to the first end surface and cracks extending from the modified layer, thus forming a separation plane containing the modified layer and the cracks; a wafer producing step of separating a plate-shaped member having a thickness corresponding to the thickness of the wafer from the ingot at the separation plane after performing the separation plane forming step, thus producing the wafer from the ingot; and a flattening step of grinding the first end surface of the ingot after performing the wafer producing step, thus flattening the front end surface of the ingot. The ingot is composed of first atoms having a larger atomic weight and second atoms having a smaller atomic weight, the first end surface of the ingot being set as a polar plane where the second atoms having a smaller atomic weight are arranged in performing the separation plane forming step. The first end surface as the polar plane where the second atoms having a smaller atomic weight are arranged is ground in the flattening step.

Preferably, the compound single crystal ingot is a SiC ingot, and the first end surface is set as a polar plane where carbon (C) atoms are arranged. Alternatively, the compound single crystal ingot is a GaN ingot, and the first end surface is set as a polar plane where nitrogen (N) atoms are arranged.

According to the wafer producing method of the present invention, the ingot is composed of first atoms having a larger atomic weight and second atoms having a smaller atomic weight, and the first end surface of the ingot is set as a polar plane where the second atoms having a smaller atomic weight are arranged in performing the separation plane forming step. That is, the laser beam is applied to the first end surface as the polar plane where the second atoms having a smaller atomic weight constituting the ingot are arranged. Further, in the flattening step, the first end surface as the polar plane where the second atoms having a smaller atomic weight are arranged is ground to be flattened. Accordingly, the wear amount of abrasive members in the case of grinding the first end surface can be reduced to ½ to ⅓ as compared with the wear amount in the case of grinding the second end surface. Further, the required time for grinding in the case of grinding the first end surface can also be reduced to ½ to ⅓ as compared with the case of grinding the second end surface.

The above and other objects, features and advantages of the present invention and the manner of realizing them will become more apparent, and the invention itself will best be understood from a study of the following description and

DETAILED DESCRIPTION OF THE PREFERRED EMBODIMENT

Figure 1:
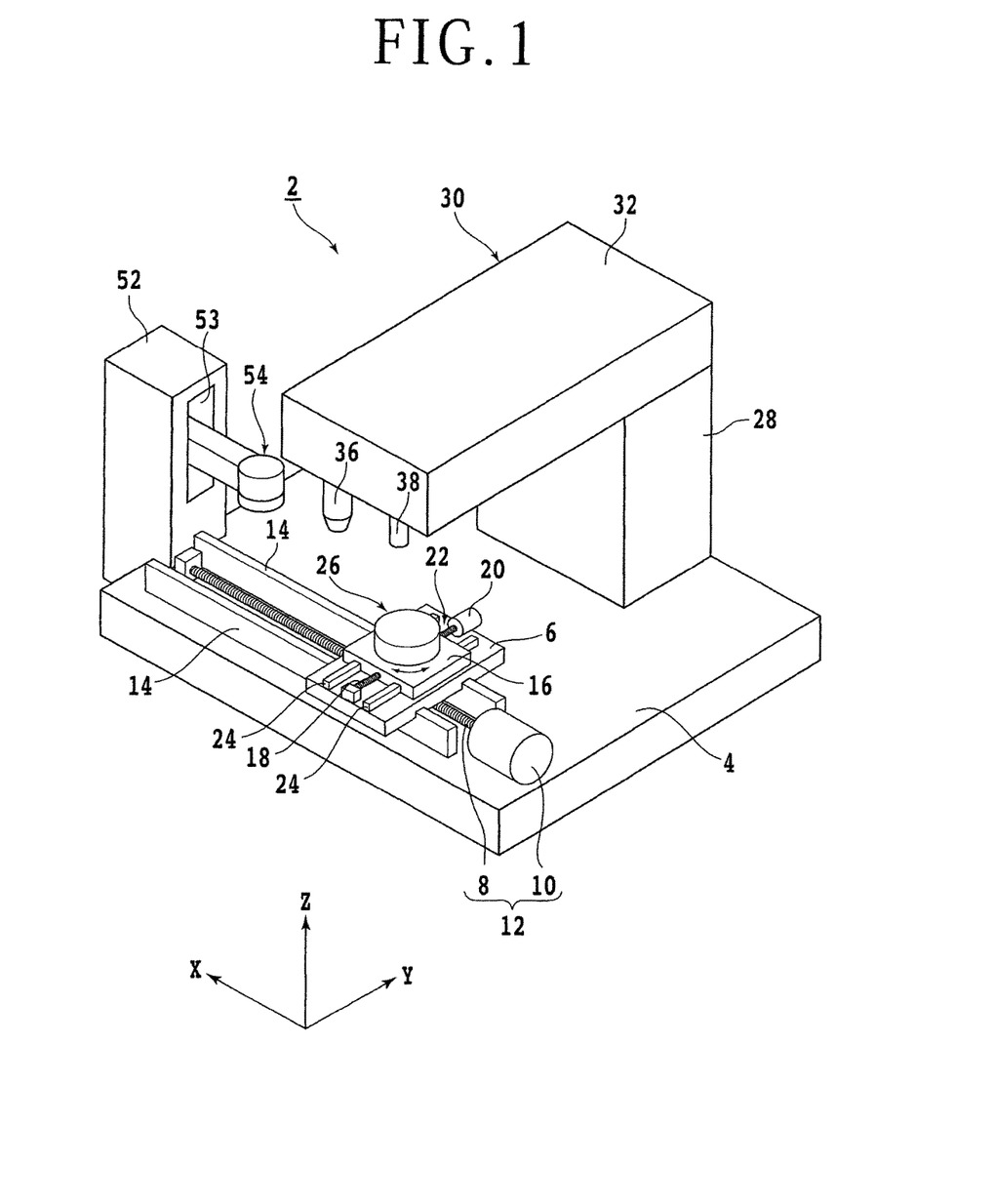
FIG. 1 is a perspective view of a laser processing apparatus suitable for use in performing the wafer producing method of the present invention.

A preferred embodiment of the present invention will now be described in detail with reference to the drawings. Referring to FIG. 1, there is shown a perspective view of a laser processing apparatus 2 suitable for use in performing the wafer producing method of the present invention. The laser processing apparatus 2 includes a stationary base 4 and a first slide block 6 mounted on the stationary base 4 so as to be movable in the X direction. The first slide block 6 is moved in a feeding direction, or in the X direction along a pair of guide rails 14 by a feeding mechanism 12 composed of a ball screw 8 and a pulse motor 10.

A second slide block 16 is mounted on the first slide block 6 so as to be movable in the Y direction. The second slide block 16 is moved in an indexing direction, or in the Y direction along a pair of guide rails 24 by an indexing mechanism 22 composed of a ball screw 18 and a pulse motor 20. A support table (chuck table) 26 is mounted on the second slide block 16. The support table 26 is movable in the X direction and the Y direction by the feeding mechanism 12 and the indexing mechanism 22 and also rotatable by a motor stored in the second slide block 16.

A column 28 is provided on the stationary base 4 so as to project upward therefrom. A laser beam applying mechanism (laser beam applying means) 30 is mounted on the column 28. The laser beam applying mechanism 30 is composed of a casing 32, a laser beam generating unit 34 (see FIG. 2) stored in the casing 32, and focusing means (laser head) 36 mounted on the front end of the casing 32. An imaging unit 38 having a microscope and a camera is also mounted on the front end of the casing 32 so as to be aligned with the focusing means 36 in the X direction.

Figure 2:
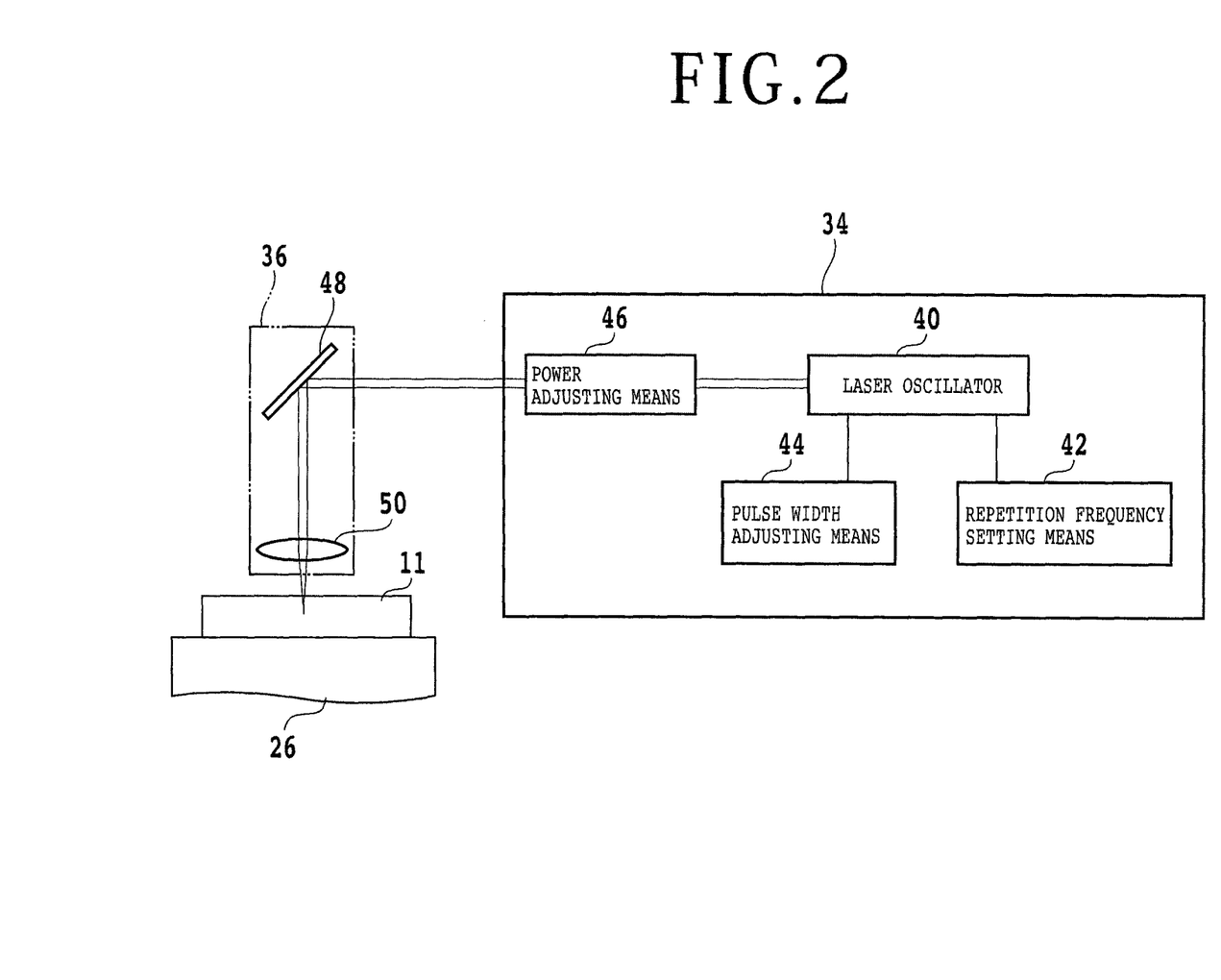
FIG. 2 is a block diagram of a laser beam generating unit.

As shown in FIG. 2, the laser beam generating unit 34 includes a laser oscillator 40 for generating a pulsed laser beam such as YAG laser and YVO4 laser, repetition frequency setting means 42 for setting the repetition frequency of the pulsed laser beam to be generated by the laser oscillator 40, pulse width adjusting means 44 for adjusting the pulse width of the pulsed laser beam to be generated by the laser oscillator 40, and power adjusting means 46 for adjusting the power of the pulsed laser beam generated by the laser oscillator 40. Although especially not shown, the laser oscillator 40 has a Brewster window, so that the laser beam generated from the laser oscillator 40 is a laser beam of linearly polarized light. After the power of the pulsed laser beam is adjusted to a predetermined power by the power adjusting means 46 of the laser beam generating unit 34, the pulsed laser beam is reflected by a mirror 48 included in the focusing means 36 and next focused by a focusing lens 50 included in the focusing means 36. The focusing lens 50 is positioned so that the pulsed laser beam is focused inside a compound single crystal ingot 11 as a workpiece fixed to the support table 26.

Figure 3A:
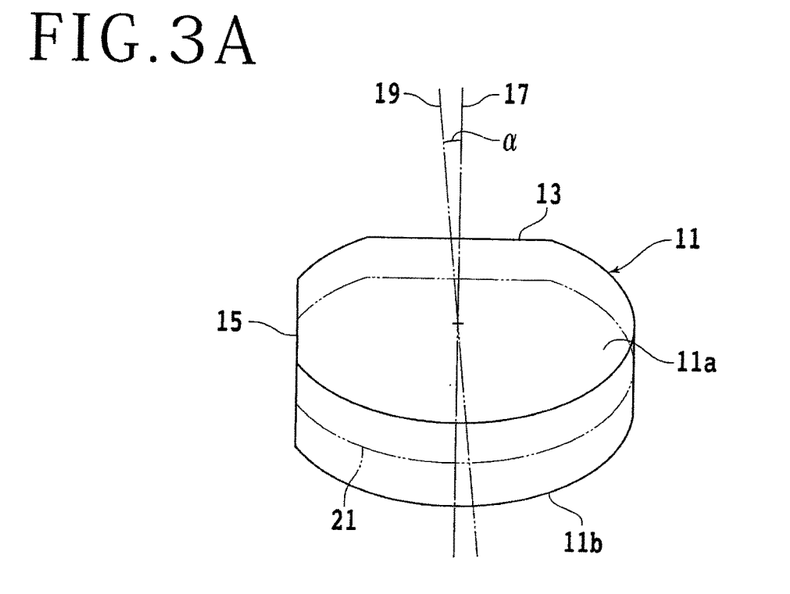
FIG. 3A is a perspective view of a compound single crystal ingot.
Figure 3B:
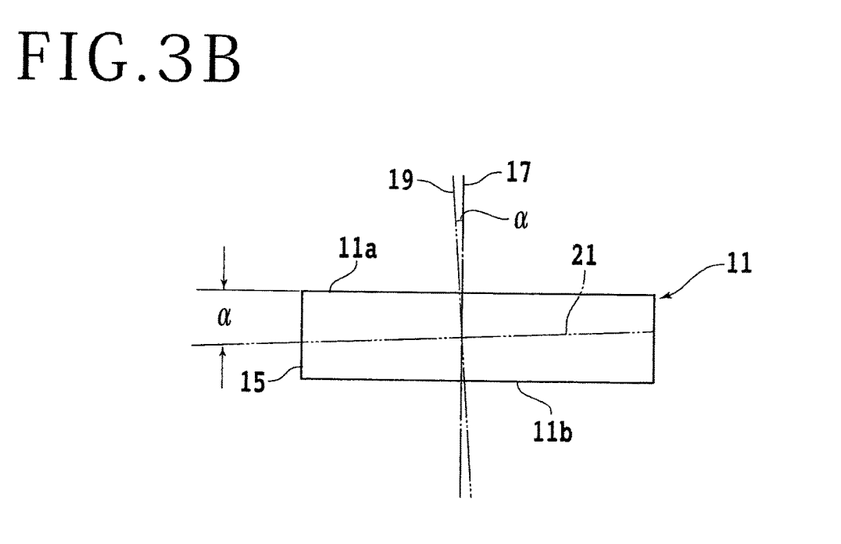
FIG. 3B is an elevational view of the compound single crystal ingot shown in FIG. 3A.

Referring to FIG. 3A, there is shown a perspective view of the compound single crystal ingot 11 as a workpiece to be processed. FIG. 3B is an elevational view of the compound single crystal ingot 11 shown in FIG. 3A. The compound single crystal ingot (which will be hereinafter referred to also simply as ingot) 11 is selected from a GaN single crystal ingot and a SiC single crystal ingot. The ingot 11 has a first end surface 11a and a second end surface 11b opposite to the first end surface 11a. The first end surface 11a of the ingot 11 is preliminarily polished to a mirror finish because the laser beam is applied to the first end surface 11a.

The ingot 11 has a first orientation flat 13 and a second orientation flat 15 perpendicular to the first orientation flat 13. The length of the first orientation flat 13 is set longer than the length of the second orientation flat 15. The first end surface 11a is a polar plane in which the atoms having a smaller atomic weight constituting the compound single crystal ingot 11 are arranged, wherein the ingot 11 is composed of the atoms having a larger atomic weight and the atoms having a smaller atomic weight. Accordingly, the second end surface 11b is a polar plane in which the atoms having a larger atomic weight are arranged.

In the case that the compound single crystal ingot 11 is a GaN ingot, the first end surface 11a is a nitrogen (N) polar plane as −c plane where the nitrogen atoms are arranged, whereas the second end surface 11b is a gallium (Ga) polar plane as +c plane where gallium atoms are arranged. On the other hand, in the case that the compound single crystal ingot 11 is a SiC ingot, the first end surface 11a is a carbon (C) polar plane as −c plane where carbon atoms are arranged, whereas the second end surface 11b is a silicon (Si) polar plane as +c plane where silicon atoms are arranged.

Referring again to FIG. 1, a column 52 is fixed to the left side of the stationary base 4. The column 52 is formed with a vertically elongated opening 53, and a pressing mechanism 54 is vertically movably mounted to the column 52 so as to project from the opening 53.

Figure 4:
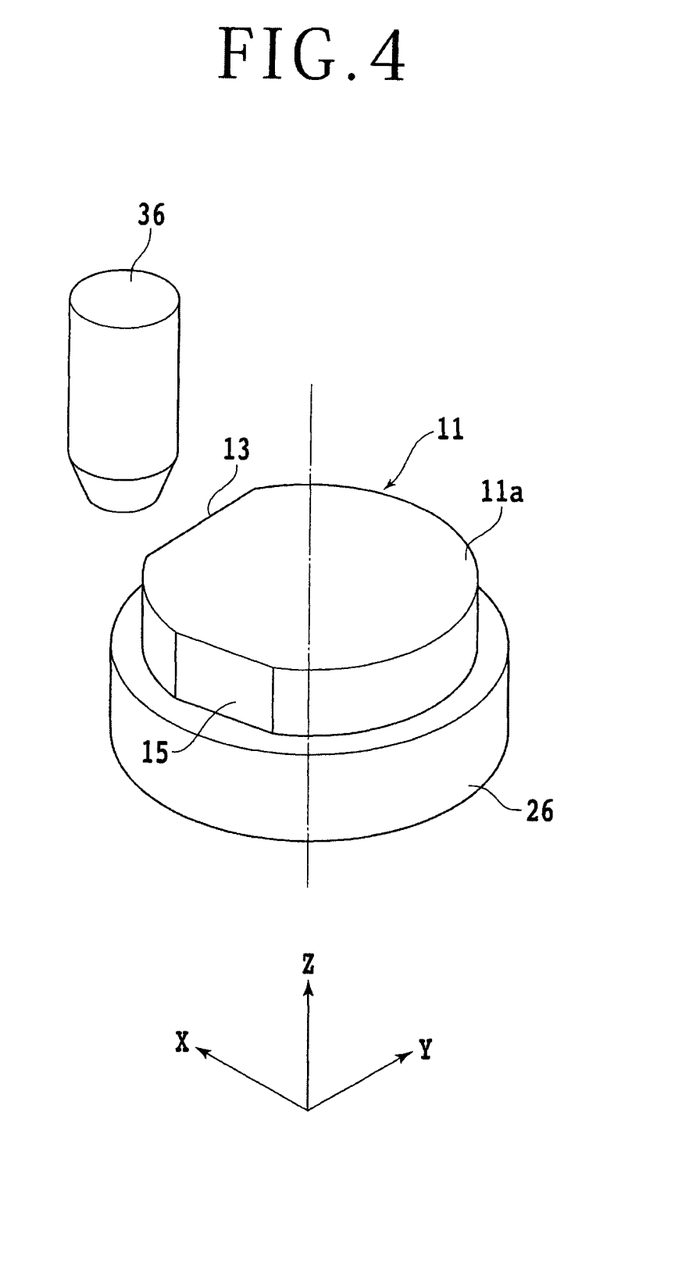
FIG. 4 is a perspective view for illustrating a separation plane forming step.

In performing the wafer producing method according to this preferred embodiment, the ingot 11 is fixed to the upper surface of the support table 26 by using a wax or adhesive in the condition where the first end surface 11a of the ingot 11 is oriented upward as shown in FIG. 4. As mentioned above, the first end surface 11a is a polar plane in which the atoms having a smaller atomic weight constituting the compound single crystal ingot 11 are arranged, wherein the ingot 11 is composed of the atoms having a larger atomic weight and the atoms having a smaller atomic weight. In the case of a GaN ingot, the first end surface 11a is an N polar plane, whereas in the case of a SiC ingot, the first end surface 11a is a C polar plane.

Figure 5:
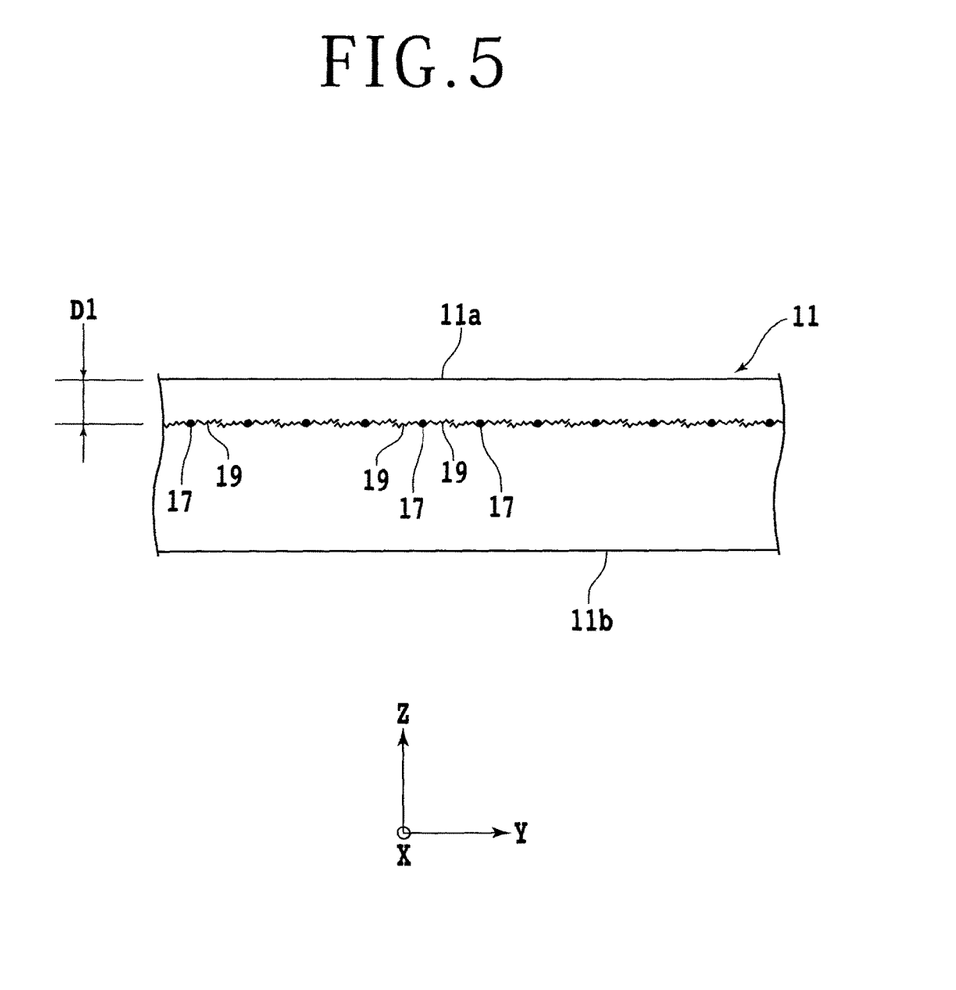
FIG. 5 is a schematic sectional view for illustrating a modified layer forming step.

After supporting the compound single crystal ingot 11 on the support table 26, a separation plane forming step is performed in such a manner that the focal point of a laser beam having a transmission wavelength (e.g., 1064 nm) to the compound single crystal ingot 11 fixed to the support table 26 is set inside the ingot 11 at a predetermined depth (shown by D1 in FIG. 5) from the first end surface 11a, which depth corresponds to the thickness of a wafer to be produced, and the laser beam is next applied to the first end surface 11a as relatively moving the focal point and the ingot 11 to thereby form a modified layer 17 parallel to the first end surface 11a and cracks 19 propagating from the modified layer 17 as shown in FIG. 5, thus forming a separation plane.

This separation plane forming step includes a modified layer forming step of relatively moving the focal point of the laser beam in the X direction to form the separation plane containing the modified layer 17 and the cracks 19 propagating from the modified layer 17 inside the ingot 11, and also includes an indexing step of relatively moving the focal point in the Y direction to thereby index the focal point by a predetermined amount.

For example, the separation plane forming step in this preferred embodiment is performed under the following laser processing conditions.

Figure 7:
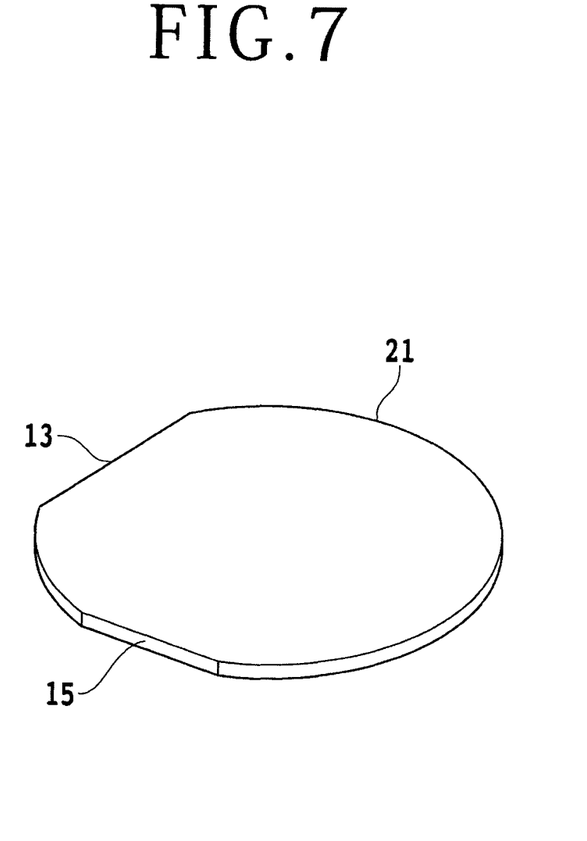
FIG. 7 is a perspective view of a wafer produced in the wafer producing step.

Light source: Nd:YAG pulsed laser
Wavelength: 1064 nm
Repetition frequency: 80 kHz
Average power: 3.2 W
Pulse width: 4 ns
Spot diameter: 10 μm
Numerical aperture (NA) of focusing lens: 0.45
Index amount: 250 μm In this manner, the focal point of the laser beam is sequentially indexed by the predetermined amount to form a plurality of modified layers 17 at the depth D1 in the whole area of the ingot 11 and the cracks 19 extending from each modified layer 17 as shown in FIG. 5. Thereafter, a wafer producing step is performed in such a manner that an external force is applied to the ingot 11 to thereby separate a plate-shaped member having a thickness corresponding to the thickness of the wafer to be produced from the ingot 11 at the separation plane composed of the modified layers 17 and the cracks 19, thus producing a compound single crystal wafer 21 shown in FIG. 7.

Figure 6A:
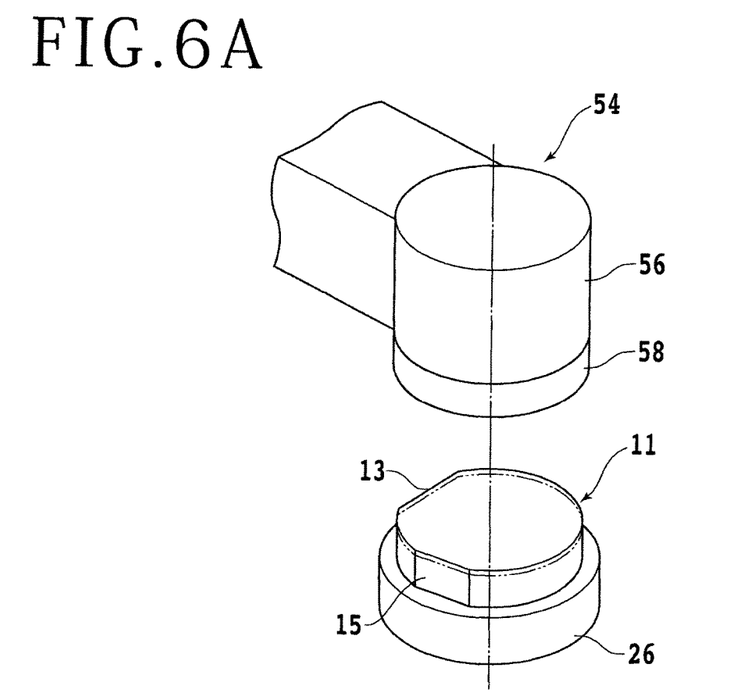
FIGS. 6A and 6B are perspective views for illustrating a wafer producing step.
Figure 6B:
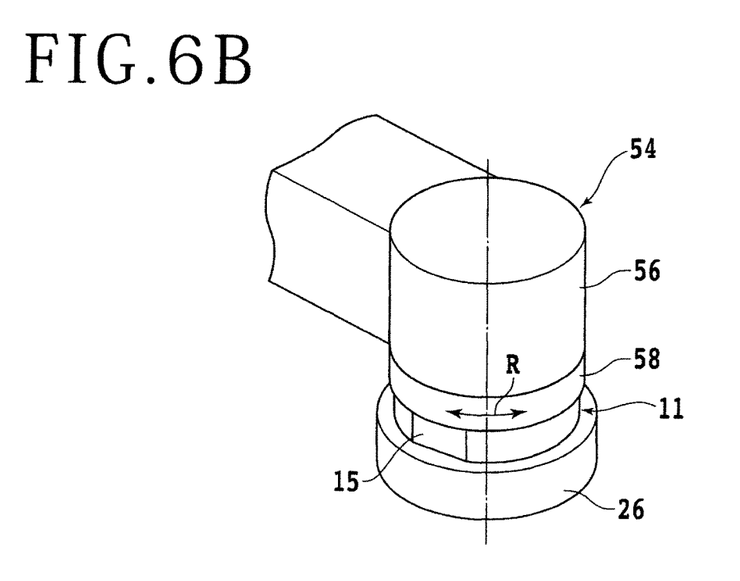

This wafer producing step is performed by using the pressing mechanism 54 shown in FIG. 1. The configuration of the pressing mechanism 54 is shown in FIGS. 6A and 6B. The pressing mechanism 54 includes a head 56 vertically movable by a moving mechanism (not shown) incorporated in the column 52 shown in FIG. 1 and a pressing member 58 rotatable in the direction shown by an arrow R in FIG. 6B with respect to the head 56. As shown in FIG. 6A, the pressing mechanism 54 is relatively positioned above the ingot 11 fixed to the support table 26. Thereafter, as shown in FIG. 6B, the head 56 is lowered until the pressing member 58 comes into pressure contact with the first end surface 11a of the ingot 11.

In the condition where the pressing member 58 is in pressure contact with the first end surface 11a of the ingot 11, the pressing member 58 is rotated in the direction of the arrow R to thereby generate a torsional stress in the ingot 11. As a result, the ingot 11 is broken at the separation plane where the modified layers 17 and the cracks 19 are formed. Accordingly, the compound single crystal wafer 21 shown in FIG. 7 can be separated from the compound single crystal ingot 11.

Figure 8:
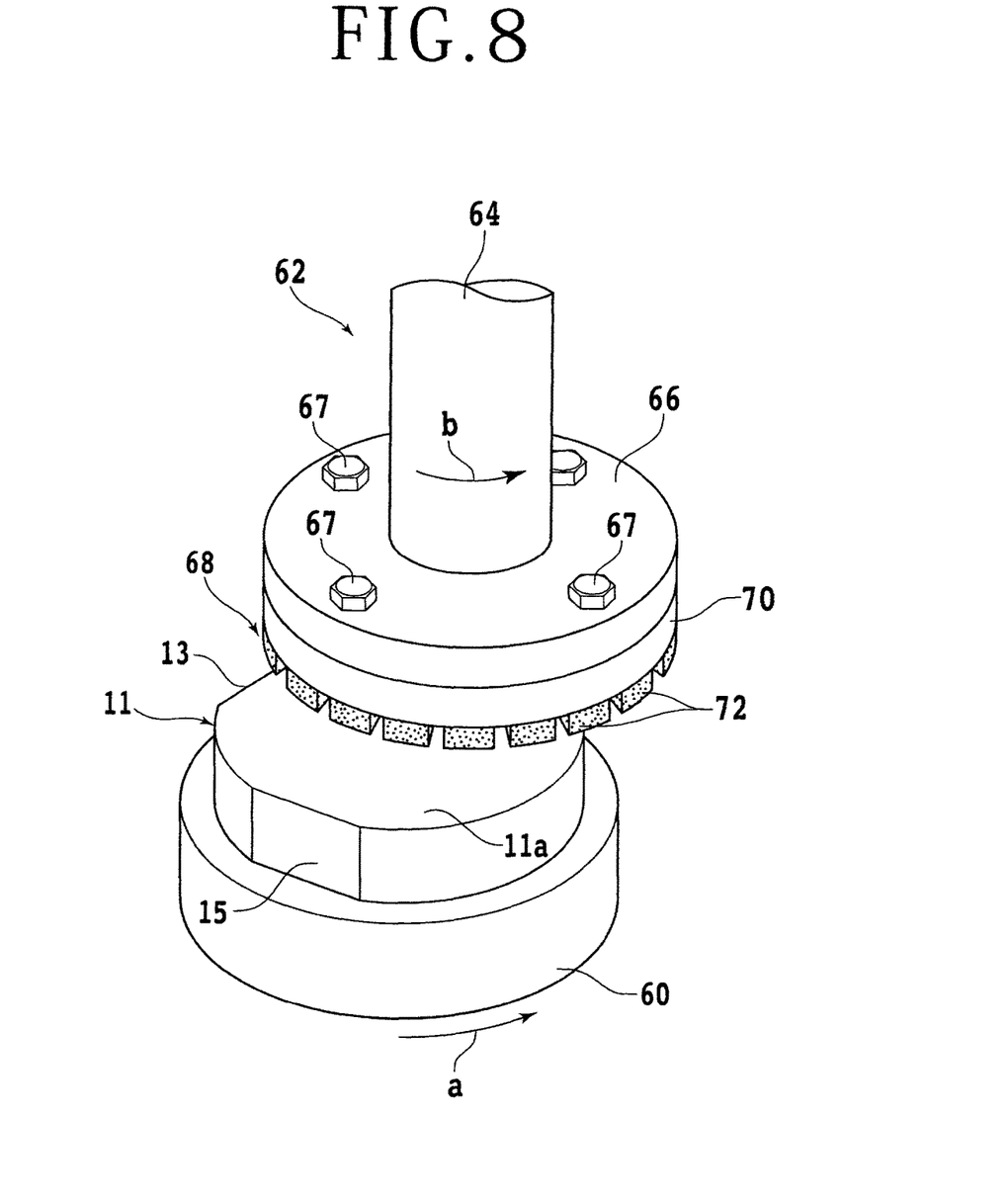
FIG. 8 is a perspective view for illustrating a flattening step.

After performing the wafer producing step, a flattening step is performed in such a manner that the first end surface 11a of the compound single crystal ingot 11 from which the wafer 21 has been separated is ground to become flattened. In this flattening step, the ingot 11 is held under suction on a chuck table 60 included in a grinding apparatus in the condition where the first end surface 11a of the ingot 11 is oriented upward as shown in FIG. 8. That is, the second end surface 11b of the ingot 11 is held on the chuck table 60 under suction. After holding the ingot 11 on the chuck table 60, a grinding unit 62 shown in FIG. 8 is used to grind the first end surface 11a of the ingot 11. As shown in FIG. 8, the grinding unit 62 includes a spindle 64, a wheel mount 66 fixed to the lower end of the spindle 64, and a grinding wheel 68 detachably mounted on the lower surface of the wheel mount 66 by means of plural screws 67. The grinding wheel 68 is composed of a wheel base 70 and a plurality of abrasive members 72 fixed to the free end (lower end) of the wheel base 70 so as to be arranged annularly.

In the flattening step, the chuck table 60 is rotated at 300 rpm, for example, in the direction shown by an arrow a, and the grinding wheel 68 is also rotated at 6000 rpm, for example, in the direction shown by an arrow b. Further, a grinding unit feeding mechanism (not shown) is driven to lower the grinding unit 62 until the abrasive members 72 of the grinding wheel 68 come into contact with the first end surface 11a of the ingot 11. Thereafter, the grinding wheel 68 is fed at a predetermined feed speed (e.g., 0.1 μm/second) to thereby grind the first end surface 11a by a predetermined amount, thereby flattening the first end surface 11a. Preferably, after performing the flattening step, the first end surface 11a ground is polished to a mirror finish.

Figure 9:
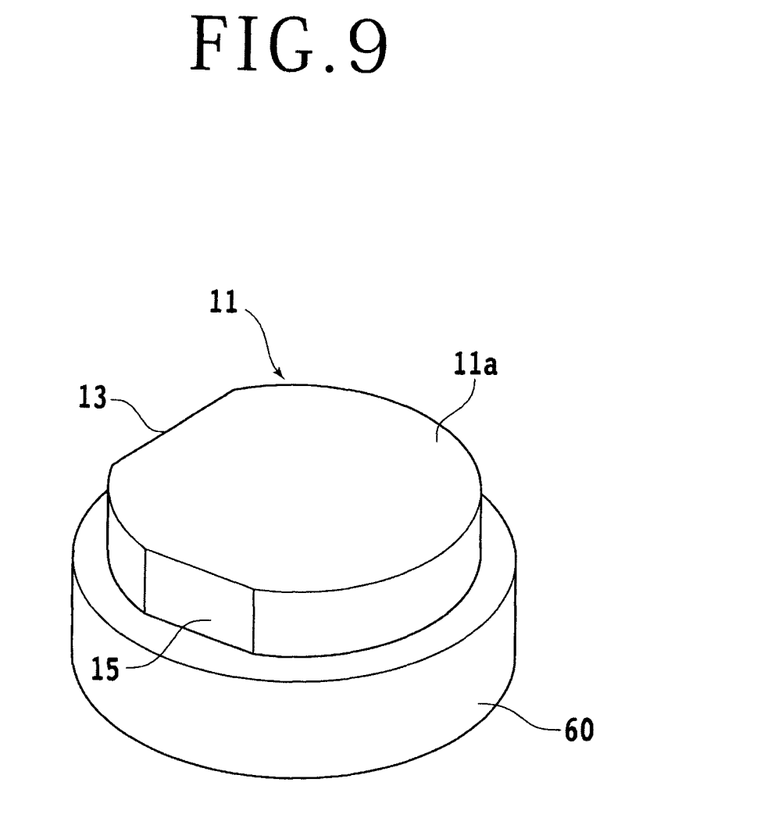
FIG. 9 is a perspective view of the compound single crystal ingot held on a chuck table in a grinding apparatus after performing the flattening step.

In this manner, the first end surface 11a of the compound single crystal ingot 11 is flattened as shown in FIG. 9 by performing the flattening step, or preferably polished to a mirror finish after grinding. Thereafter, the separation plane forming step mentioned above is performed again. A comparison was made between the case that the first end surface 11a is ground in the flattening step and the case that the second end surface 11b is ground in the flattening step.

Comparison test (1)
  Compound single crystal ingot: GaN ingot
  Grinding amount: 5 μm
  Grinding of Ga polar plane (second end surface 11b)
  Wear amount of abrasive members: 6.3 μm
  Grinding time: 2.5 minutes
  Grinding of N polar plane (first end surface 11a)
  Wear amount of abrasive members: 2.5 μm
  Grinding time: 1 minute
Comparison test (2)
  Compound single crystal ingot: SiC ingot
  Grinding amount: 5 μm
  Grinding of Si polar plane (second end surface 11b)
  Wear amount of abrasive members: 7.5 μm
  Grinding time: 3 minutes
  Grinding of C polar plane (first end surface 11a)
  Wear amount of abrasive members: 3.5 μm
  Grinding time: 1.5 minutes According to the above preferred embodiment, the first end surface 11a of the compound single crystal ingot 11 is a polar plane in which the atoms having a smaller atomic weight constituting the ingot 11 are arranged, wherein the ingot 11 is composed of the atoms having a larger atomic weight and the atoms having a smaller atomic weight. In the separation plane forming step, the laser beam is applied to the first end surface 11a of the ingot 11 to form the separation plane inside the ingot 11, wherein the separation plane is composed of the modified layers 17 and the cracks 19. In the flattening step, the first end surface 11a as a polar plane where the atoms having a smaller atomic weight are arranged is ground to be flattened. Accordingly, the wear amount (consumption) of the abrasive members 72 in the case of grinding the first end surface 11a was reduced to ½ to ⅓ as compared with the wear amount in the case of grinding the second end surface 11b as apparent from the above results of comparison. Further, the grinding time (required time for grinding) in the case of grinding the first end surface 11a was also reduced to ½ to ⅓ as compared with the case of grinding the second end surface 11b as apparent from the above results of comparison.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing method for producing a wafer from a compound single crystal ingot having a first end surface and a second end surface opposite to the first end surface, the wafer producing method comprising:

a separation plane forming step of holding the second end surface of the compound single crystal ingot on a chuck table, next setting a focal point of a laser beam having a transmission wavelength to the ingot inside the ingot at a predetermined depth from the first end surface of the ingot, which depth corresponds to a thickness of the wafer to be produced, and next applying the laser beam to the first end surface as relatively moving the focal point and the ingot to thereby form a modified layer parallel to the first end surface and cracks extending from the modified layer, thus forming a separation plane containing the modified layer and the cracks;

a wafer producing step of separating a plate-shaped member having a thickness corresponding to the thickness of the wafer from the ingot at the separation plane after performing the separation plane forming step, thus producing the wafer from the ingot; and a flattening step of grinding the first end surface of the ingot after performing the wafer producing step, thus flattening the front end surface of the ingot, wherein the ingot is composed of first atoms having a larger atomic weight and second atoms having a smaller atomic weight, the first end surface of the ingot being set as a polar plane where the second atoms having a smaller atomic weight are arranged in performing the separation plane forming step, and the first end surface as the polar plane where the second atoms having a smaller atomic weight are arranged is ground in the flattening step, wherein the compound single crystal ingot is a SiC ingot, and the first end surface is set as a polar plane where carbon (C) atoms are arranged.

* * * * *